(12) United States Patent
Zhu et al.

(10) Patent No.: US 10,411,209 B2
(45) Date of Patent: Sep. 10, 2019

(54) METHODS FOR PRODUCING PEROVSKITE HALIDE FILMS

(71) Applicant: Alliance for Sustainable Energy, LLC, Golden, CO (US)

(72) Inventors: Kai Zhu, Littleton, CO (US); Mengjin Yang, Littleton, CO (US); Yuanyuan Zhou, Providence, RI (US); Nitin P. Padture, Providence, RI (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 135 days.

(21) Appl. No.: 15/437,779

(22) Filed: Feb. 21, 2017

(65) Prior Publication Data

US 2017/0244057 A1 Aug. 24, 2017

Related U.S. Application Data

(60) Provisional application No. 62/298,079, filed on Feb. 22, 2016.

(51) Int. Cl.
*H01L 51/42* (2006.01)
*H01L 51/00* (2006.01)

(52) U.S. Cl.
CPC ...... *H01L 51/4213* (2013.01); *H01L 51/0015* (2013.01); *H01L 51/4226* (2013.01); *Y02E 10/549* (2013.01)

(58) Field of Classification Search
None
See application file for complete search history.

(56) References Cited

U.S. PATENT DOCUMENTS

2017/0133163 A1* 5/2017 Russell ............... H01G 9/2072

OTHER PUBLICATIONS

Pang et al. Chem. Mater., 2014, 26 (3), pp. 1485-1491 (Year: 2014).*
Eperon et al., "Cation exchange for thin film lead iodide perovskite interconversion," Mater. Horiz., 2016, 3, 63-71. (Year: 2016).*
Pang et al., Transformative Evolution of Organolead Triiodide Perovskite Thin Films from Strong Room-Temperature Solid-Gas Interaction between $HPbI_3$—$CH_3NH_2$ Precursor Pair, Journal of the American Chemical Society, vol. 138, Jan. 5, 2016, pp. 750-753.
Shi et al., Low trap-state density and long carrier diffusion in organolead trihalide perovskite single crystals, Science, vol. 347, Issue 6221, Jan. 30, 2015, pp. 519-522.
CN 105336856 A, Qingdao Institute of Bioenergy & Bioprocess Technology CAS), including English Translation, Feb. 17, 2016, 15 pages.

(Continued)

*Primary Examiner* — Eli S Mekhlin
(74) *Attorney, Agent, or Firm* — Michael A. McIntyre

(57) ABSTRACT

An aspect of the present disclosure is a method that includes exchanging at least a portion of a first cation of a perovskite solid with a second cation, where the exchanging is performed by exposing the perovskite solid to a precursor of the second cation, such that the precursor of the second cation oxidizes to form the second cation and the first cation reduces to form a precursor of the first cation.

10 Claims, 12 Drawing Sheets

(56) References Cited

OTHER PUBLICATIONS

Eperon et al., "Cation exchange for thin film lead iodide perovskite interconversion," Materials Horizons, Oct. 2, 2015, Abstract, 2 pages.
Eperon et al., "Formamidinium lead trihalide: a broadly tunable perovskite for efficient planar heterojunction solar cells," Energy & Environmental Science, vol. 7, 2014, pp. 982-988.
Eperon et al., Supplementary information, "Formamidinium lead trihalide: a broadly tunable perovskite for efficient planar heterojunction solar cells," Energy & Environmental Science, vol. 7, 2014, 13 pages.
Moore et al., "Impact of the organic halide salt on final perovskite composition for photovoltaic applications," Applied Physics Letters Materials, vol. 2, Jul. 7, 2014, pp. 081802-1-081802-7.
Yang et al., "High-performance photovoltaic perovskite layers fabricated through intramolecular exchange," Science, vol. 348, Issue 6240, Jun. 12, 2015, pp. 1234-1237.
International Search Report and Written Opinion of the International Searching Authority for corresponding PCT patent application No. PCT/US17/18663 dated May 22, 2017.

\* cited by examiner

METHODS FOR PRODUCING PEROVSKITE HALIDE FILMS

CROSS-REFERENCE TO RELATED APPLICATIONS

This application claims priority to U.S. Provisional Application No. 62/298,079 filed Feb. 22, 2016, the contents of which are incorporated herein by reference in its entirety.

CONTRACTUAL ORIGIN

The United States Government has rights in this disclosure under Contract No. DE-AC36-08GO28308 between the United States Department of Energy and the Alliance for Sustainable Energy, LLC, the Manager and Operator of the National Renewable Energy Laboratory.

BACKGROUND $\alpha$-HC(NH$_2$)$_2$PbI$_3$ ($\alpha$-FAPbI$_3$) perovskite films are highly desirable for perovskite solar cells (PSCs) due to their enhanced sunlight absorption extending into the infrared (IR). However, the thin-film deposition of ($\alpha$-FAPbI$_3$) perovskite is significantly more challenging compared to its CH$_3$NH$_3$PbI$_3$ (MAPbI$_3$) perovskite counterpart.

Films of organolead trihalide perovskites have been studied extensively as light-absorbing materials, which are at the heart of the new perovskite solar cells (PSCs). The unique combination of low-cost solution-processing, and high power-conversion efficiencies (PCEs) rivaling those of conventional Si-based solar cells, holds great promise for PSCs. While methylammonium lead triiodide (CH$_3$NH$_3$PbI$_3$ or MAPbI$_3$) perovskite, with a bandgap of ~1.55 eV, is the most widely studied in the context of PSCs, formamidinium lead triiodide ($\alpha$-HC(NH$_2$)$_2$PbI$_3$ or $\alpha$-FAPbI$_3$) perovskite for PSCs is also very promising. This is primarily because FAPbI$_3$ has a smaller band gap of ~1.45 eV, extending light absorption into the infrared region of the solar spectrum.

Since the morphology of perovskite films plays a central role in determining the PCE of PSCs, unprecedented efforts have been made in order to control the film uniformity and/or tailor the perovskite microstructures, with particular emphasis on MAPbI$_3$ perovskite. However, the development of effective protocols for the engineering of FAPbI$_3$ perovskite film morphologies and microstructures are lagging due to the following challenges. First, the 'ionic radius' of FA$^+$ cation (2.79 Å) is larger than that of MA$^+$ cation (2.70 Å), and the molecular structures of FA$^+$ and MA$^+$ cations are quite different, both of which are expected to affect solution-growth kinetics of $\alpha$-FAPbI$_3$ perovskite. Second, FAPbI$_3$ also crystallizes in a 'yellow' $\delta$-FAPbI$_3$ non-perovskite polymorph at room temperature, which is associated with the formation of the $\alpha$-FAPbI$_3$ perovskite. Therefore, the growth of phase-pure $\alpha$-FAPbI$_3$ perovskite films requires stricter control over the synthetic procedures compared with MAPbI$_3$, which is a major hurdle in the path of realizing the full potential of $\alpha$-FAPbI$_3$ perovskite for PSCs. Thus, there is a need for methods that overcome these difficulties to produce high quality $\alpha$-FAPbI$_3$ perovskite films suitable for PSCs.

SUMMARY

An aspect of the present disclosure is a method that includes exchanging at least a portion of a first cation of a perovskite solid with a second cation, where the exchanging is performed by exposing the perovskite solid to a precursor of the second cation, such that the precursor of the second cation oxidizes to form the second cation and the first cation reduces to form a precursor of the first cation. In some embodiments of the present disclosure, the exchanging may be performed by exposing the perovskite solid to a gas that includes the precursor of the second cation. In some embodiments of the present disclosure, the exposing may be performed with the gas at a pressure between about 0.1 atmospheres and about 5 atmospheres. In some embodiments of the present disclosure, the exchanging may be performed at a temperature between 100° C. and 300° C. In some embodiments of the present disclosure, the perovskite solid may include at least one of a particle and/or a film.

In some embodiments of the present disclosure, the perovskite solid may be defined by ABX$_3$, where A includes at least one of the first cation or the second cation, B includes a third cation, and X includes an anion. In some embodiments of the present disclosure, the first cation may include methylammonium. In some embodiments of the present disclosure, the second cation may include at least one of formamidinium, guanidinium, acetamidinium, and/or ethylammonium. In some embodiments of the present disclosure, the second cation may include formamidinium. In some embodiments of the present disclosure, the third cation may include a metal in the 2+ valence state. In some embodiments of the present disclosure, the metal may include at least one of lead, tin, and/or germanium. In some embodiments of the present disclosure, the anion may include a halogen. In some embodiments of the present disclosure, the halogen may include at least one of fluorine, chlorine, bromine, and/or iodine.

In some embodiments of the present disclosure, the precursor of the second cation may include at least one of formylimidamide, guanidine, acetamidine, and/or ethylamine. In some embodiments of the present disclosure, the precursor of the first cation may include methylammonia. In some embodiments of the present disclosure, the perovskite solid may be converted from methylammonium lead triiodide to formamidinium lead triiodide. In some embodiments of the present disclosure, the method may further include, prior to the exchanging, forming the perovskite solid by at least one of a solution deposition method and/or a vapor deposition method. In some embodiments of the present disclosure, the method may further include, producing the gas by reacting a salt-precursor of the precursor of the second cation with a hydroxide salt. In some embodiments of the present disclosure, the salt-precursor of the precursor of the second cation may include formamidine acetate. In some embodiments of the present disclosure, the hydroxide salt may include sodium hydroxide.

An aspect of the present disclosure is a device that includes a film of formamidinium lead triiodide, where the formamidinium lead triiodide has a short-circuit density of greater than 22.0 mA/cm$^2$. In some embodiments of the present disclosure, the film may have thickness between 10 nm and 3 μm. In some embodiments of the present disclosure, the device may further include a substrate, where the film is in physical contact with the substrate. In some embodiments of the present disclosure, the substrate may include at least one of at least one of a transparent conducting oxide, a glass, a metal foil, and/or a plastic. In some embodiments of the present disclosure, the device may have a power-conversion efficiency of greater than 17%.

REFERENCE NUMERALS

100 . . . perovskite
110 . . . A-cation

120 . . . B-cation
130 . . . anion (X)
200 . . . exchange process
210 . . . cation precursor
300 . . . method
310 . . . forming
320 . . . exchanging
700 . . . system
710 . . . hotplate
720 . . . substrate
730 . . . MAPbI$_3$ perovskite film/α-FAPbI$_3$ perovskite film
740 . . . CaO dryer
750 . . . FA(Ac)+NaOH
760 . . . box

BRIEF DESCRIPTION OF THE DRAWINGS

Exemplary embodiments are illustrated in referenced figures of the drawings. It is intended that the embodiments and figures disclosed herein are to be considered illustrative rather than limiting.

DETAILED DESCRIPTION

The present disclosure may address one or more of the problems and deficiencies of the prior art discussed above. However, it is contemplated that some embodiments as disclosed herein may prove useful in addressing other problems and deficiencies in a number of technical areas. Therefore, the embodiments described herein should not necessarily be construed as limited to addressing any of the particular problems or deficiencies discussed herein.

Figure 1:
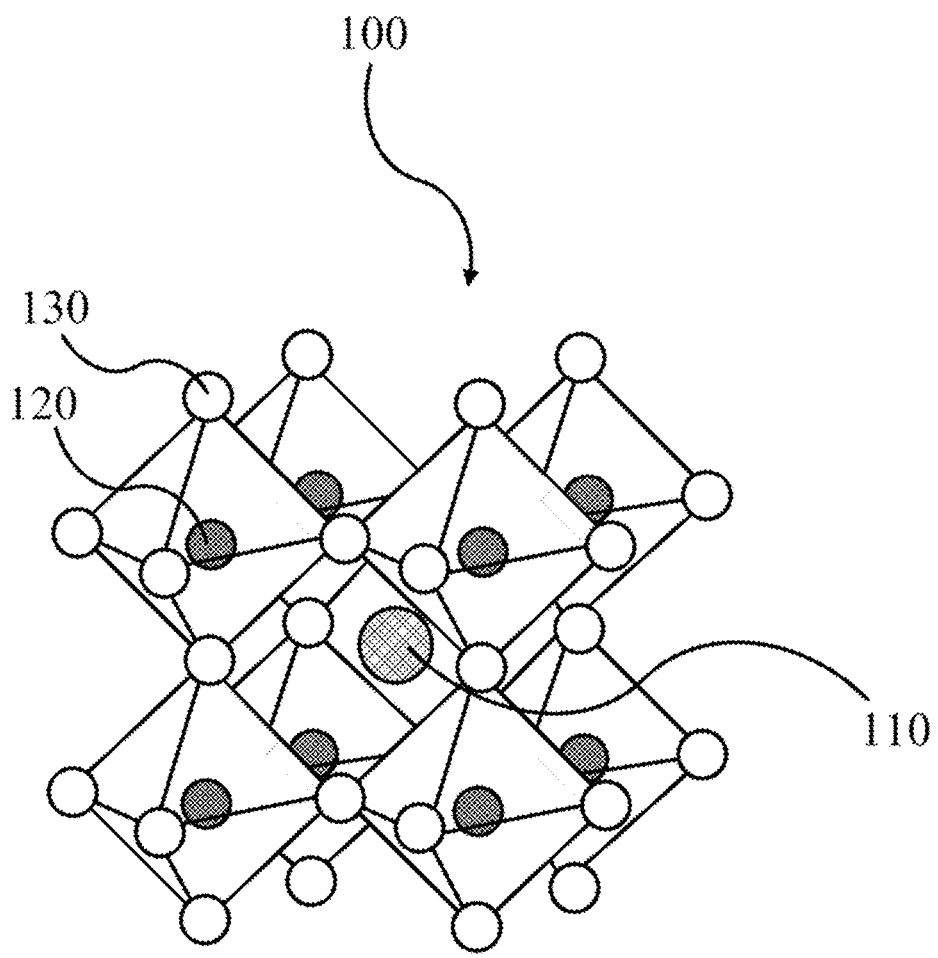
FIG. 1 illustrates the structure of a perovskite, according to some embodiments of the present disclosure.

FIG. 1 illustrates that a perovskite may organize into cubic crystalline structures and may be described by the general formula ABX$_3$, where X (130) is an anion and A (110) and B (120) are cations, typically of different sizes with the A-cation 110 typically larger than the B-cation 120. In a cubic unit cell, the B-cation 120 resides at the eight corners of a cube, while the A-cation 110 is located at the center of the cube and is surrounded by twelve X-anions 130 centrally located between B-cations 120 along each edge of the unit cell. Typical inorganic perovskites include calcium titanium oxide (calcium titanate) minerals such as, for example, CaTiO$_3$ and SrTiO$_3$. In some embodiments of the present invention, the A-cation 110 may include a nitrogen-containing organic compound such as an alkyl ammonium compound. The B-cation 120 may include a metal and the X-anion 130 may include a halogen.

Additional examples for an A-cation A 110 include organic cations and/or inorganic cations. A-cations 110 may be an alkyl ammonium cation, for example a C$_{1-20}$ alkyl ammonium cation, a C$_{1-6}$ alkyl ammonium cation, a C$_{2-6}$ alkyl ammonium cation, a C$_{1-5}$ alkyl ammonium cation, a C$_{1-4}$ alkyl ammonium cation, a C$_{1-3}$ alkyl ammonium cation, a C$_{1-2}$ alkyl ammonium cation, and/or a C$_1$ alkyl ammonium cation. Further examples of organic A-cations 110 include methylammonium (CH$_3$NH$_3^+$), ethylammonium (CH$_3$CH$_2$NH$_3^+$), propylammonium (CH$_3$CH$_2$CH$_2$NH$_3^+$), butylammonium (CH$_3$CH$_2$CH$_2$CH$_2$NH$_3^+$), formamidinium (NH$_2$CH=NH$_2^+$), and/or any other suitable nitrogen-containing organic compound. In other examples, an A-cation 110 may include an alkylamine. Thus, an A-cation 110 may include an organic component with one or more amine groups. For example, an A-cation 110 may be an alkyl diamine halide such as formamidinium (CH(NH$_2$)$_2$)$^+$.

Examples of metal B-cations 120 include, for example, lead, tin, germanium, and or any other 2+ valence state metal that can charge-balance the perovskite 100. Examples for the anion 130 include halogens: e.g. fluorine, chlorine, bromine, iodine and/or astatine. In some cases, a perovskite 100 may include more than one anion 130, for example pairs of halogens; chlorine and iodine, bromine and iodine, and/or any other suitable pairing of halogens. In other cases, the perovskite 100 may include two or more halogens of fluorine, chlorine, bromine, iodine, and/or astatine.

Thus, the A-cation 110, the B-cation 120, and the anion 130 (X) may be selected within the general formula of ABX$_3$ to produce a wide variety of perovskites 100, including, for example, methylammonium lead triiodide (CH$_3$NH$_3$PbI$_3$), and mixed halide perovskites such as CH$_3$NH$_3$PbI$_{3-x}$Cl$_x$ and CH$_3$NH$_3$PbI$_{3-x}$Br$_x$. Thus, a perovskite 100 may have more than one halogen element, where the various halogen elements are present in none integer quantities; e.g. x is not equal to 1, 2, or 3. In addition, perovskite halides, like other organic-inorganic perovskites, can form three-dimensional (3-D), two-dimensional (2-D), one-dimensional (1-D) or zero-dimensional (0-D) networks, possessing the same unit structure.

As stated above, the A-cation 110 may include an organic constituent in combination with a nitrogen constituent. In some cases, the organic constituent may be an alkyl group such as straight-chain and/or branched saturated hydrocarbon group having from 1 to 20 carbon atoms. In some embodiments, an alkyl group may have from 1 to 6 carbon atoms. Examples of alkyl groups include methyl ($C_1$), ethyl ($C_2$), n-propyl ($C_3$), isopropyl ($C_3$), n-butyl ($C_4$), tert-butyl ($C_4$), sec-butyl ($C_4$), iso-butyl ($C_4$), n-pentyl ($C_5$), 3-pentanyl ($C_5$), amyl ($C_5$), neopentyl ($C_5$), 3-methyl-2-butanyl ($C_5$), tertiary amyl ($C_5$), and n-hexyl ($C_6$). Additional examples of alkyl groups include n-heptyl ($C_7$), n-octyl ($C_8$) and the like.

Figure 2:
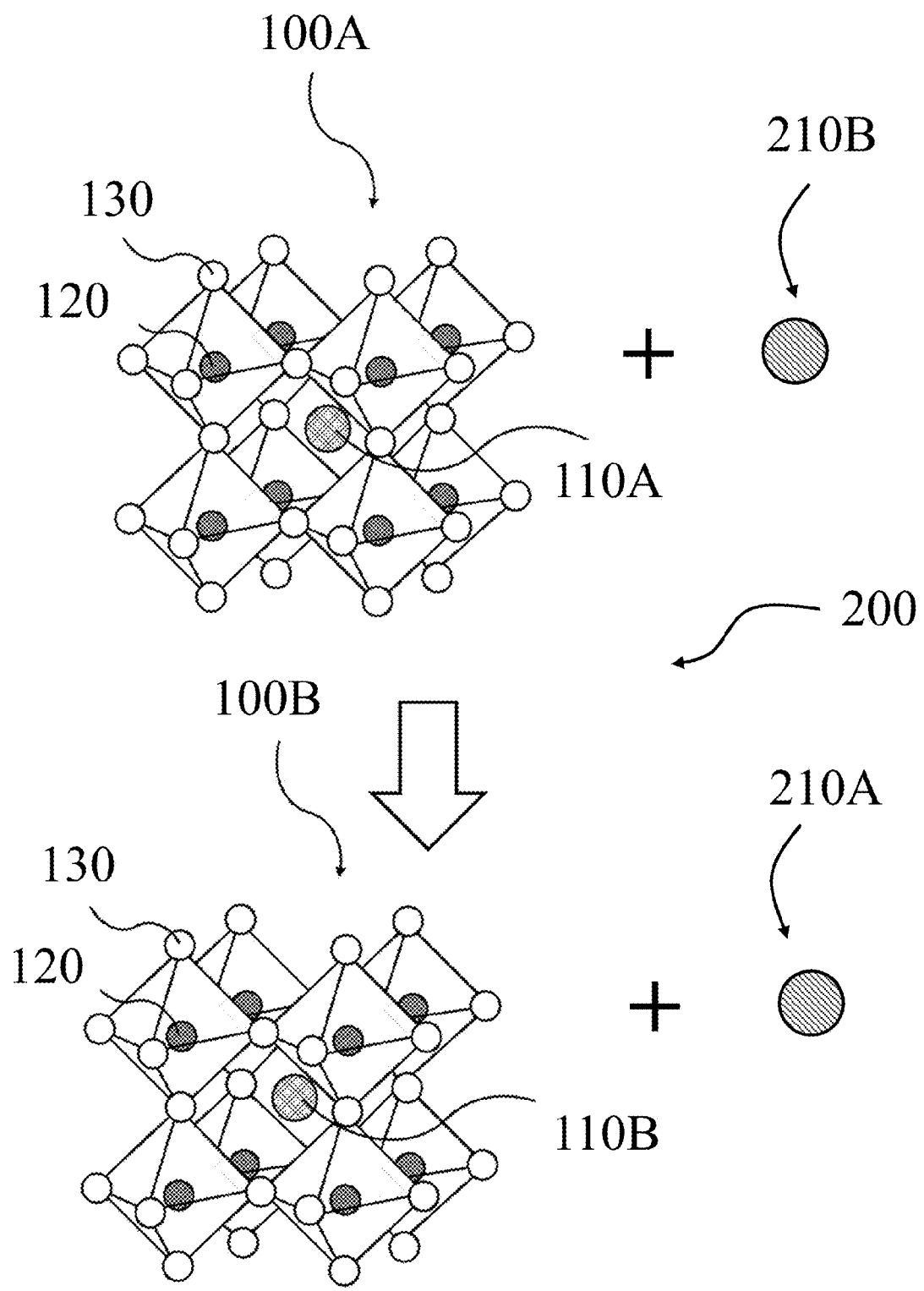
FIG. 2 illustrates an exchange process for converting a first perovskite to a second perovskite, according to some embodiments of the present disclosure.

FIG. 2 illustrates an exchange process 200 for converting a first perovskite 100A having a first A-cation 110A to a second perovskite 100B having a second A-cation 110B by exposing the first perovskite 100A to a precursor of the second A-cation 110B, referred to herein as the second cation precursor 210B. The exposing results in the second cation precursor 210B being oxidized to produce the second A-cation 110B, and the first A-cation 110B being reduced to produce a precursor of the first A-cation 110A, referred to herein as the first cation precursor 201A. In addition, the exposing of the first perovskite 100A to the second cation precursor 210 triggers the exchange process 200 in which the first A-cation 110A is exchanged with the second A-cation 110B, with the expulsion of the first cation precursor 210A from the first perovskite 100A to form the second perovskite 100B. Thus, the exchange process 200 may be performed with the first perovskite 100A and the second perovskite 100B in solid crystalline phases, for example, as films and/or particles and by exposing the first perovskite 100A to the second cation precursor 210B in the gas phase. According to some embodiments of the present disclosure, the first perovskite 100A may be a MAPbI$_3$ perovskite film, the second perovskite 100B may be an α-FAPbI$_3$ perovskite film, such that the first A-cation 110A is methyl ammonium, the first cation precursor 210A is methyl ammonia, the second A-cation 110B is formamidinium, and the second cation precursor 210B is formylimidamide.

Figure 3:
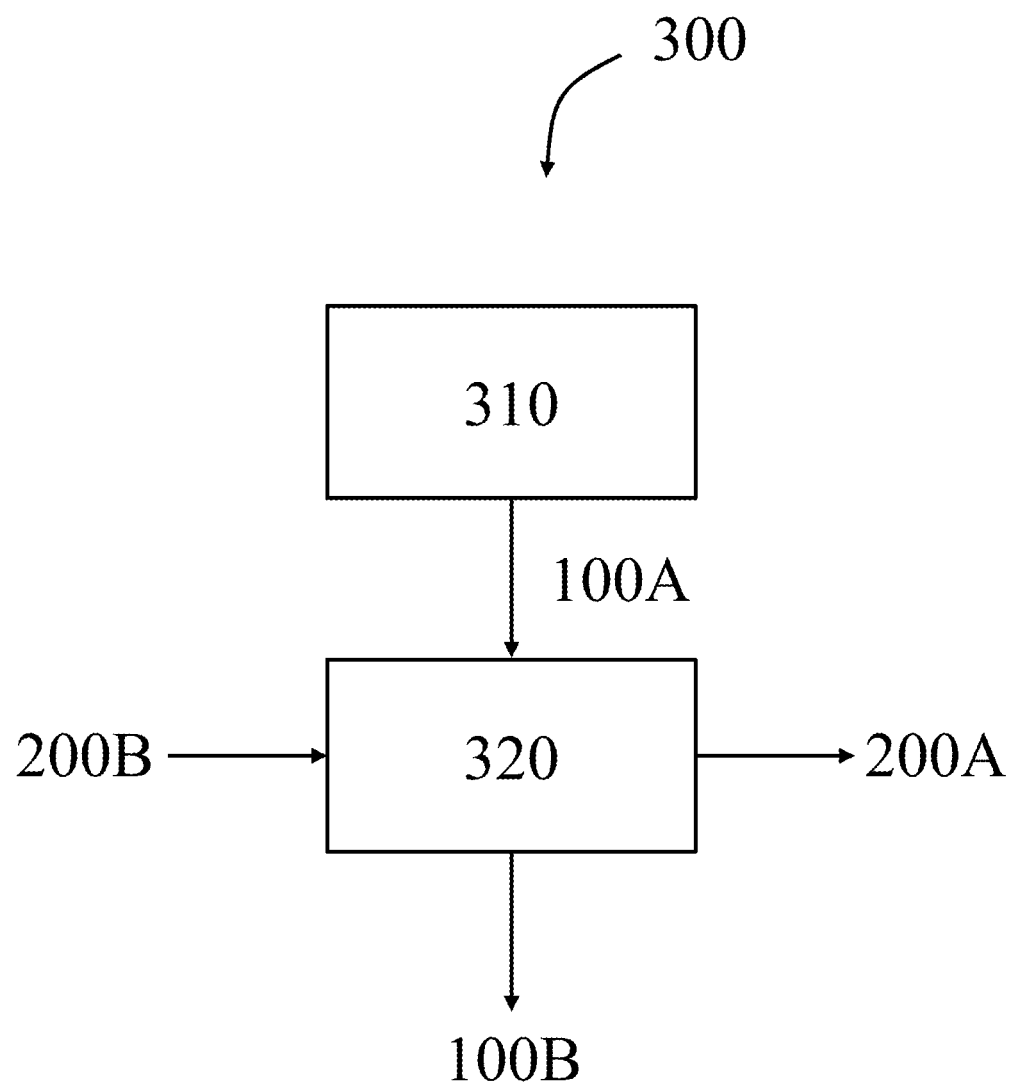
FIG. 3 illustrates a method for converting a first perovskite to a second perovskite, according to some embodiments of the present disclosure.

FIG. 3 illustrates a method 300 for converting a first perovskite 100A to a second perovskite 100B according to the exchange process (not shown) described above for FIG. 2, according to some embodiments of the present disclosure. The method 300 may begin with the forming 310 of a first perovskite 100A, where the forming 310 may be achieved by solution and annealing methods as described below. In some embodiments, the forming 310 may result in a first perovskite 100A that is a MAPbI$_3$ perovskite film. The first perovskite 100A may then be converted to a second perovskite 100B by an exchanging 320 of the A-cation (not shown) of the first perovskite 100A with the A-cation (not shown) of the second perovskite 100B. For example, as described above, a first perovskite 100A of a MAPbI$_3$ perovskite film may be converted to a second perovskite 100B of an α-FAPbI$_3$ perovskite film by exchanging 320 a first A-cation of methyl ammonium (not shown) of the first perovskite 100A with a second A-cation of formamidinium (not shown) of the second perovskite 100B. The exchanging 320 may be accomplished by exposing the first perovskite 100A to a precursor of the second cation, referred to herein as the second cation precursor 210B, such that the exchanging 320 produces the second perovskite 100B and the first cation precursor 200A, for example methyl ammonia.

Thus, some embodiments of the present disclosure relate to solvent-free, irreversible methods for converting methylammonium lead iodide (MAPbI$_3$) perovskite films to formamidinium lead triiodide (α-HC(NH$_2$)$_2$PbI$_3$ or α-FAPbI$_3$) perovskite films while preserving the high-quality morphology of the original MAPbI$_3$ perovskite films. This approach may entail exposing a starting MAPbI$_3$ perovskite film to H$_2$N—CH=NH (formylimidamide) gas at elevated temperatures, for example at about 150° C., for a period of time, for example about 4 minutes, which results in an efficient cation-displacement redox reaction and a morphology-preserving conversion of the starting MAPbI$_3$ perovskite film to a α-FAPbI$_3$ perovskite film. Insights into the mechanisms responsible for the success of this gas-based approach are provided below. In addition, high-efficiency perovskite solar cells (PSCs) fabricated from the resultant α-FAPbI$_3$ perovskite films confirm the efficacy of this approach in preserving the high-quality morphology of the original MAPbI$_3$ perovskite films.

As shown schematically in FIG. 2, exposing an as-deposited, smooth MAPbI$_3$ perovskite film to gaseous H$_2$N—CH=NH (formylimidamide) (150° C., 5 min) resulted in the conversion of the MAPbI$_3$ film to an α-FAPbI$_3$ film. As described above, the exchange process for converting the MAPbI$_3$ film to the α-FAPbI$_3$ film involved reaction (1) below, which includes the reduction (proton donation) of CH$_3$NH$_3^+$ (methylammonium) into neutral CH$_3$NH$_2$ (methylammonia), and the oxidation (proton acceptance) of neutral H$_2$N—CH=NH (formylimidamide) into H$_2$N—CH=NH$_2^+$ (formamidinium):

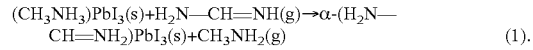

$$(CH_3NH_3)PbI_3(s) + H_2N-CH=NH(g) \rightarrow \alpha\text{-}(H_2N-CH=NH_2)PbI_3(s) + CH_3NH_2(g) \quad (1).$$

Figure 4A:
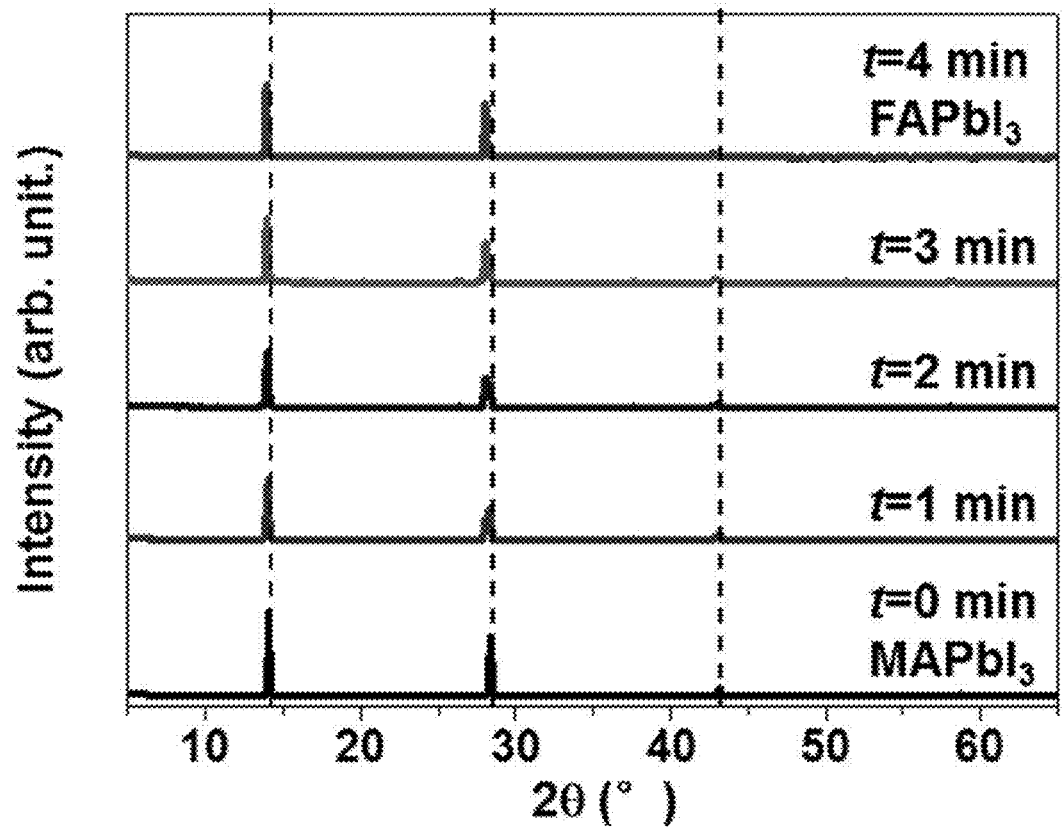
FIG. 4A illustrates X-ray diffraction (XRD) patterns of formylimidamide-gas-treated (150° C.) films for t=0 to 4 min, according to some embodiments of the present disclosure. (A). The vertical dashed lines mark the peak positions of MAPbI$_3$ perovskite.
Figure 4B:
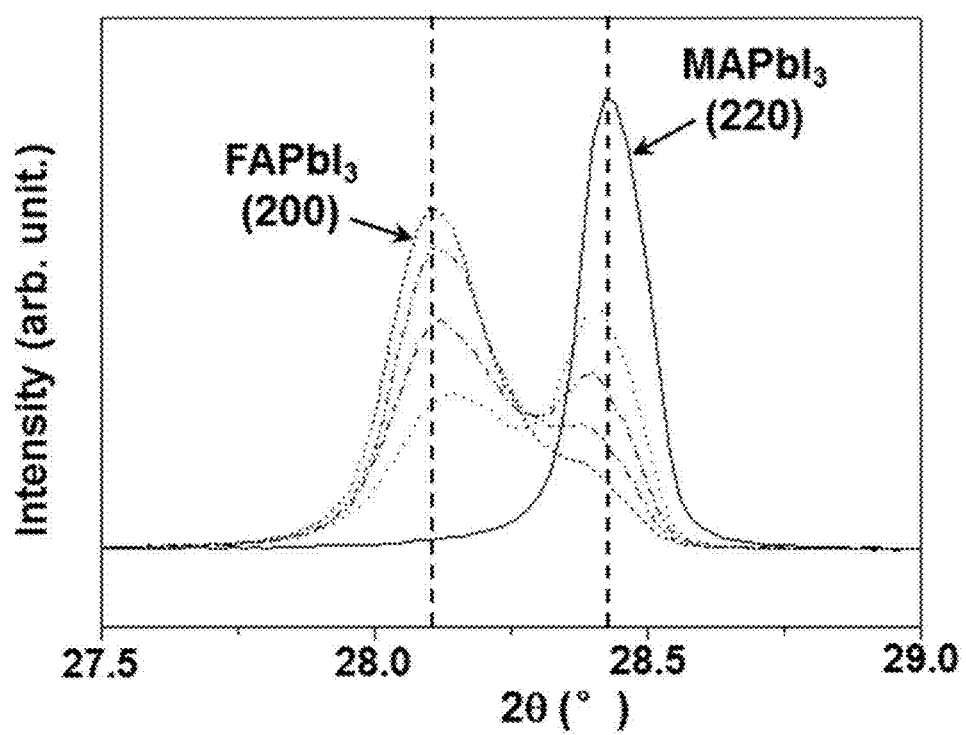
FIG. 4B illustrates higher-resolution XRD patterns (overlaid) of films corresponding to those shown in FIG. 4A. Vertical dashed lines mark the MAPbI$_3$ (220) and α-FAPbI$_3$ (200) perovskite peak positions, respectively.

FIGS. 4A and 4B plot X-ray diffraction (XRD) patterns showing the progression of reaction (1) at t=~1, 2, 3, and 4 minutes of formylimidamide treatment at about 150° C. A gradual shift of the peaks to lower 2θ was observed in FIG. 2A. FIG. 2B shows the details of the XRD patterns in the 2θ range 27.50° to 29.00°. The presence of phase-pure MAPbI$_3$ perovskite at t=0 min was confirmed by the presence of the 220 reflection at 2θ=28.42°. With exposure to formylimidamide gas, the FAPbI$_3$ perovskite 200 reflection started to appear centered around 2θ=28.10°. With increasing formylimidamide treatment duration, the intensity of the α-FAPbI$_3$ perovskite 200 reflection increased, at the expense of the MAPbI$_3$ 220 reflection. At t=4 min, the MAPbI$_3$→α-FAPbI$_3$ conversion was complete. Since the α-FAPbI$_3$ perovskite phase is thermodynamically stable at 150° C., the formation of the undesirable 'yellow' δ-FAPbI$_3$ non-perovskite phase during reaction (1) was apparently completely suppressed.

It should be noted that although the method describe above utilizes formylimidamide, other compounds such as guanidine/guadinium cation (HNC(NH$_2$)$_2$→C(NH$_2$)$_3^+$), acetamidine/acetamidinium cation (CH$_3$CHNHNH$_2$→CH$_3$CH(NH$_2$)$_2^+$), and/or ethylamine/ethylammonium cation (CH$_3$CH$_2$NH$_2$→CH$_3$CH$_2$NH$_3^+$) may also achieve the same effects achieved by formylimidamide, resulting in final perovskite films such as guanidinium lead triiodide, acetamidinium lead triiodide, and/or ethylammonium lead triiodide. For example, a MAPbI$_3$ perovskite film may be exposed to guanidine to produce a guanidinium lead triiodide perovskite film, a MAPbI$_3$ perovskite film may be exposed to acetamidine to produce an acetamidinium lead triiodide perovskite film, and/or a MAPbI$_3$ perovskite film may be exposed to ethylamine to produce an ethylammonium lead triiodide perovskite film. In addition, although the displacement reaction illustrated above in reaction (1) may be irreversible any the perovskite films produced may be converted a second time (or more) by subsequent reactions with a different displacement compound. For example, a formamidinium lead triiodide perovskite film may be converted to a guanidinium lead triiodide perovskite film by exposing the formamidinium lead triiodide perovskite film to guanidine. Or a guanidinium lead triiodide perovskite film may be converted to an acetamidinium lead triiodide perovskite film by exposing the guanidinium lead triiodide perovskite film to acetamidine.

Figure 4C:
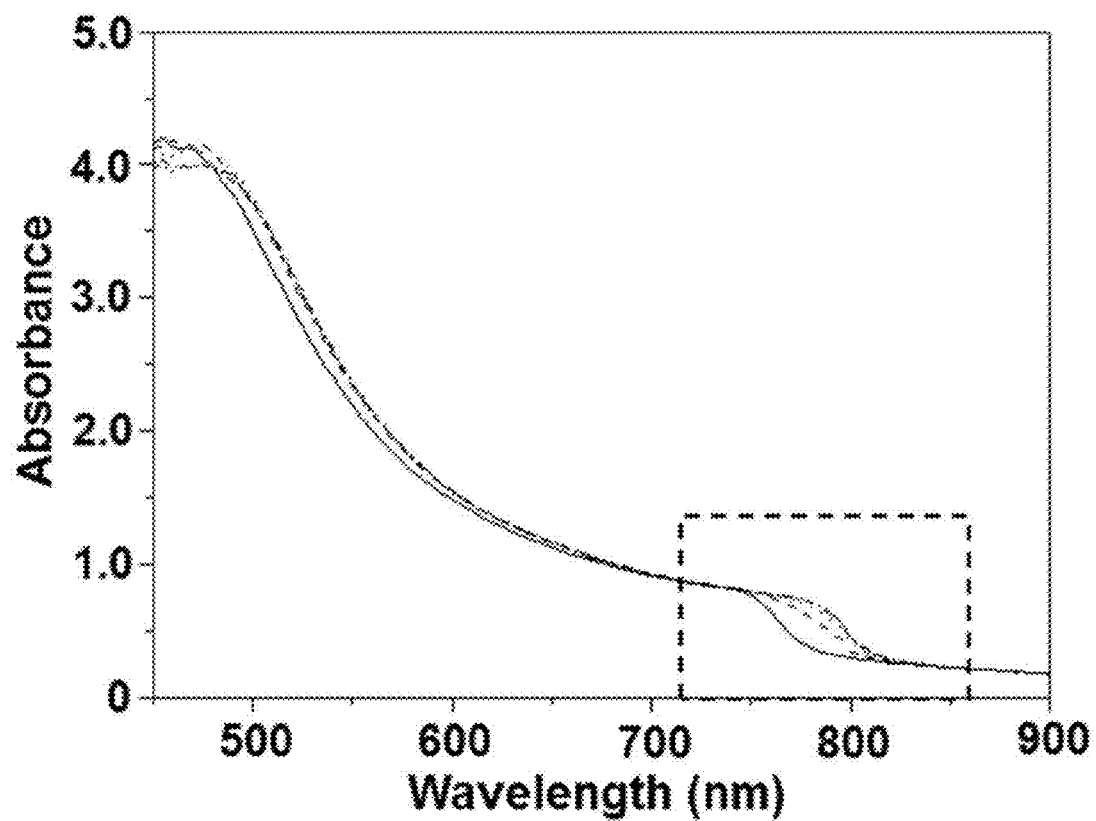
FIG. 4C illustrates optical absorption spectra of the formylimidamide-gas-treated (150° C.) films for t=0 to 4 min, according to some embodiments of the present disclosure.
Figure 4D:
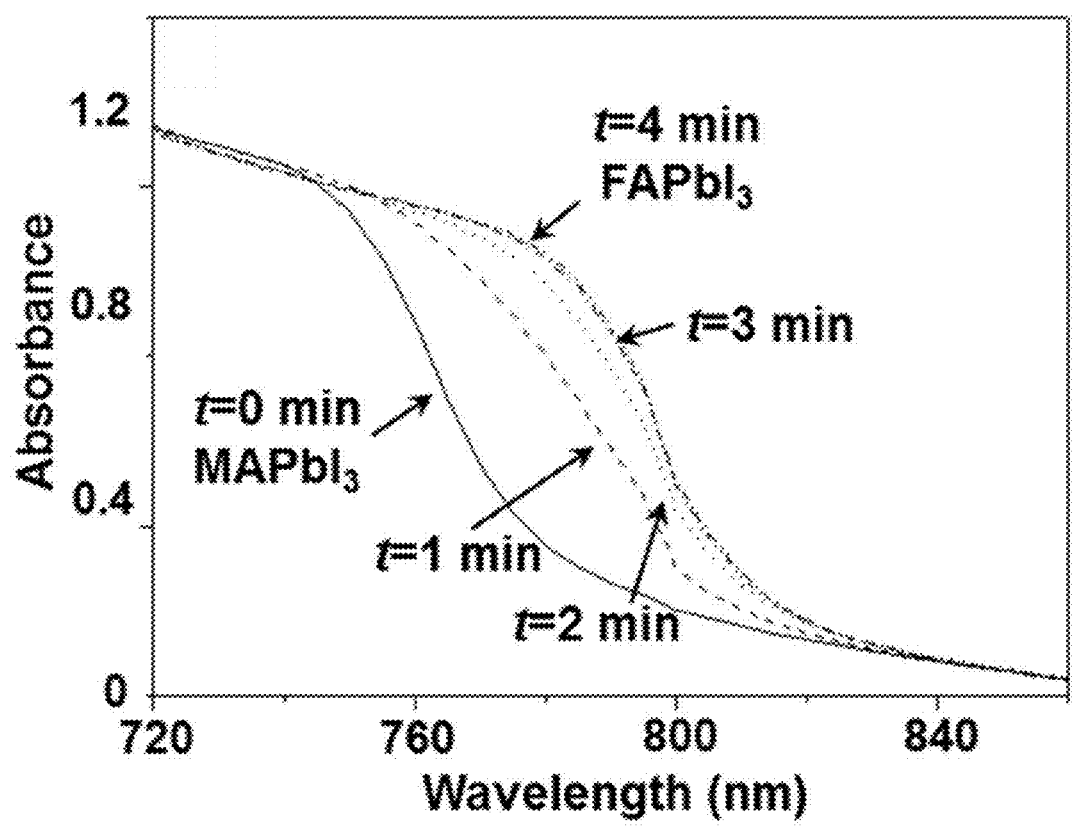
FIG. 4D illustrates higher resolution optical absorption spectra for the dashed rectangle shown in FIG. 4C.

FIGS. 4C and 4D show optical-absorption spectra for the films at t=~1, 2, 3, and 4 minutes of formylimidamide gas treatment at about 150° C., corresponding to the XRD patterns in FIGS. 4A and 4B. While the absorbance at low wavelengths in all the films was virtually indistinguishable, at longer wavelengths the extension of absorbance into IR is clearly seen in FIG. 4C. FIG. 4D shows details of the absorption spectra in the IR range, where the absorption was extended by ~30 nm into the IR. Thus, the XRD and the optical absorption data confirm the feasibility of the MAPbI$_3$→α-FAPbI$_3$ phase conversion phase conversion using the formylimidamide-gas treatment.

Figure 5:
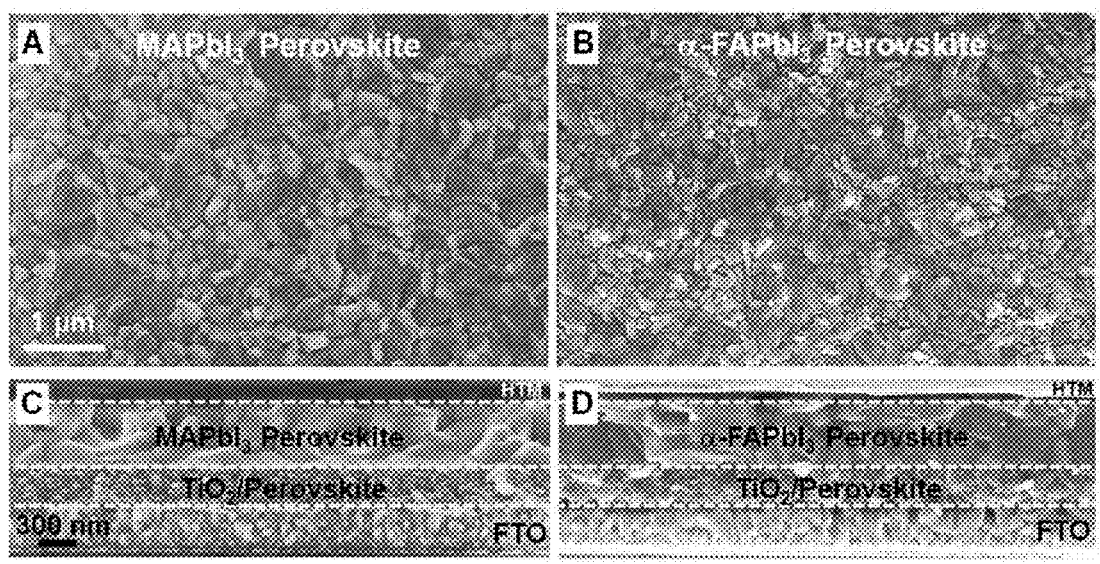
FIG. 5 illustrates experimental data obtained, according to some embodiments of the present disclosure. Panels A and B show scanning electron microscope (SEM) micrographs of perovskite films: (Panel A) MAPbI$_3$ and (Panel B) α-FAPbI$_3$. Panels C and D show cross-section SEM micrographs of PSCs made from perovskites: (Panel C) MAPbI$_3$ and (Panel D) α-FAPbI$_3$. The different PSC layers are marked.

FIG. 5, Panels A and B are top-view SEM images of MAPbI$_3$ and α-FAPbI$_3$ perovskite films (after t=~4 minutes formylimidamide-gas-treatment at about 150° C.), respectively. The dense, full-coverage MAPbI$_3$ perovskite film in Panel A of FIG. 5 was deposited where the uniform morphology of that film is clearly evident. Most remarkably, the same uniform morphology was maintained in the converted α-FAPbI$_3$ perovskite film, as seen in Panel B of FIG. 5. Panels C and D of FIG. 5 show cross-sectional SEM morphologies of the MAPbI$_3$ and α-FAPbI$_3$ perovskite films, respectively. The structures of the mesoscopic TiO$_2$/perovskite and the perovskite-capping layers between the two SEM micrographs appear indistinguishable. These results confirm the MAPbI$_3$→α-FAPbI$_3$ perovskite conversion without degradation in the morphology of the films.

The success of this formylimidamide-gas-induced MAPbI$_3$→α-FAPbI$_3$ phase conversion, while preserving the film morphology, may be attributed to the following. With wishing to be bound by theory, first, MAPbI$_3$ exhibits cubic crystalline structure (space group Pm$\bar{3}$m) at elevated temperatures (150° C.) with a lattice parameter of a=6.31 nm, while FAPbI$_3$ also has a cubic, or a pseudocubic, crystal structure (space group Pm$\bar{3}$m or Pm31) with a=6.36 nm. This inherent structural similarity favors MAPbI$_3$→α-FAPbI$_3$ conversion. Second, there is a very small difference (~0.2%) between the densities of MAPbI$_3$ (4.092 Mg·m$^{-3}$) and α-FAPbI$_3$ (4.101 Mg·m$^{-3}$), precluding any issues associated with volume change during the MAPbI$_3$→α-FAPbI$_3$ conversion. Third, unlike reversible ion-exchange reactions, redox reaction (1) is inherently irreversible, favoring the MAPbI$_3$→α-FAPbI$_3$ conversion kinetics. Finally, no solvents were used in reaction (1) precluding any solvent-induced degradation of thin-film morphology. This is in contrast with the solution-based ion-exchange process, which allows compositional tuning of the MAPbI$_3$-FAPbI$_3$ perovskite films, but it uses solvents such as isopropanol that can partially dissolve the perovskite, degrading their morphology.

Figure 6A:
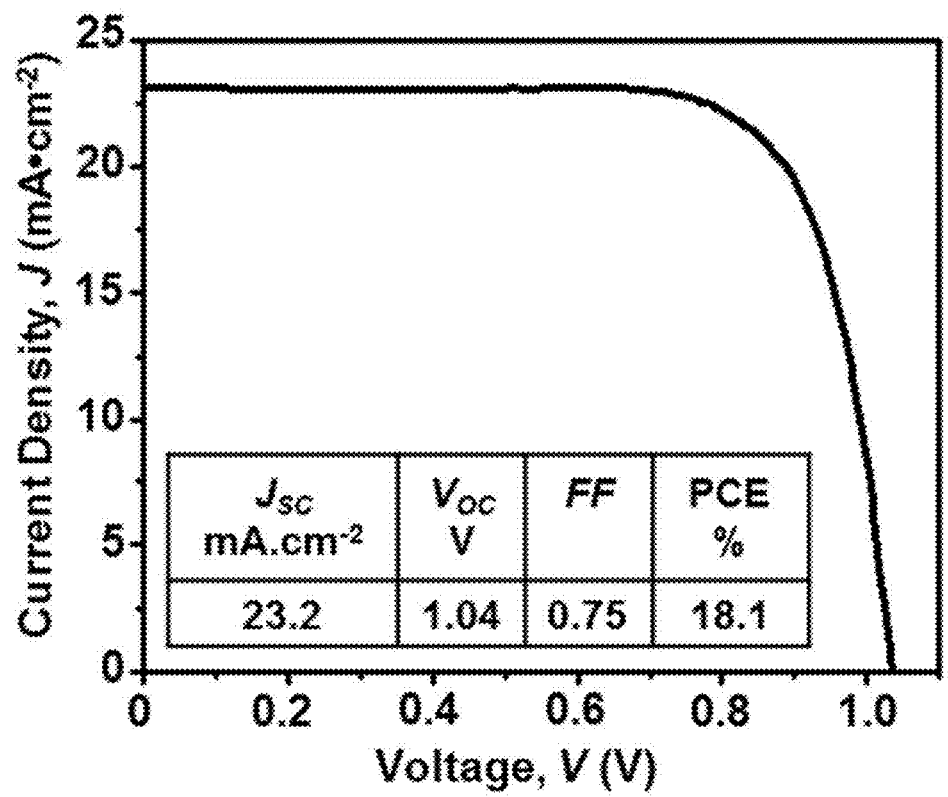
FIG. 6A illustrates current density (J)-voltage (V) J-V curve from the best α-FAPbI$_3$-based PSC (inset: PV performance parameters), according to some embodiments of the present disclosure.
Figure 6B:
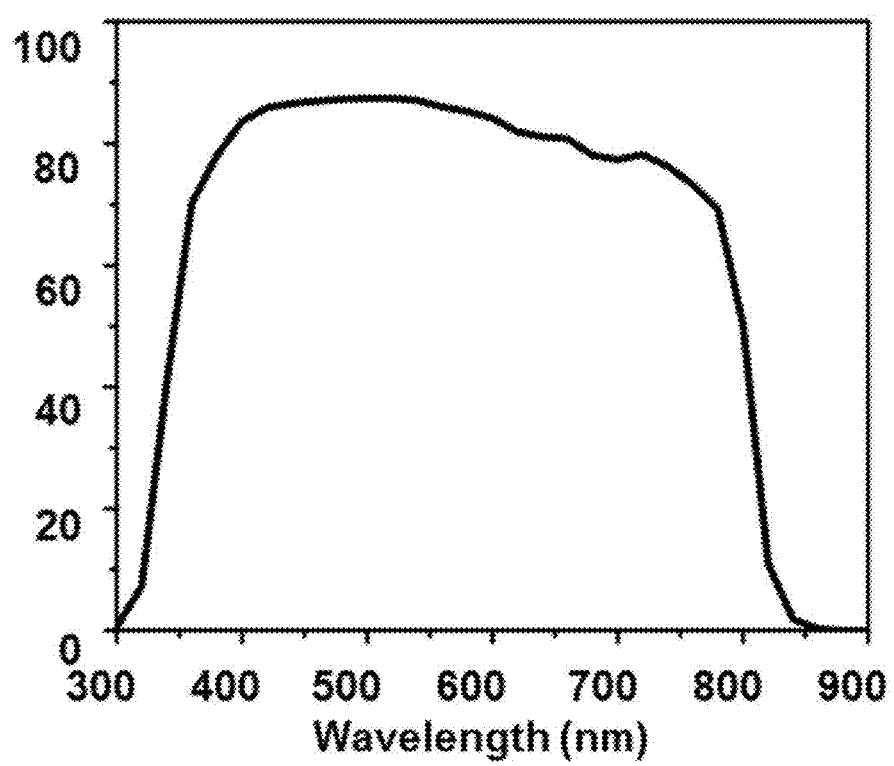
FIG. 6B illustrates the corresponding external quantum efficiency (EQE) response for current density data of FIG. 6A, according to some embodiments of the present disclosure.

In order to evaluate the quality of the converted α-FAPbI$_3$ perovskite films, PSCs made from those films (Panel D of FIG. 5) were tested under 1 sun (100 mW·cm$^{-2}$) AM1.5G irradiation. FIG. 6A shows J-V curve for the best PSC showing PCE of 17.9%, along with the extracted PV parameters. Notably, the short-circuit current-density ($J_{SC}$) of the α-FAPbI$_3$ PSC shows a high value of 22.8 mA cm$^{-2}$, which is clearly attributed to the enhanced absorption in the IR region of the solar spectrum by the α-FAPbI$_3$ perovskite. FIG. 6B shows the EQE spectrum of the α-FAPbI$_3$ PSC with $J_{SC}$ of 21.9 mA·cm$^{-2}$, which compares favorably to that measured from the J-V curve in FIG. 6A. These results clearly show that the high quality of the original MAPbI$_3$ perovskite thin-film morphology was preserved in the α-FAPbI$_3$ perovskite films during the formylimidamide-gas-induced conversion.

Lead iodine acid (HPbI$_3$) powders were prepared using an anti-solvent vapor-assisted crystallization approach. Briefly, 0.461 g of PbI$_2$ and 0.224 g of hydroiodic acid (57 wt % in water, unstabilized, Sigma-Aldrich, USA) were mixed and dissolved in 0.493 g of N,N-dimethylformamide (DMF; 99.8%, Sigma-Aldrich, USA) solvent to form a 50 wt % HPbI$_3$ solution. The as-prepared HPbI$_3$ solution was then heated at 80° C. in the chlorobenzene (CBE) vapor environment overnight. During the heat-treatment, the CBE molecules diffused into the HPbI$_3$ DMF solution, which reduced the solubility of HPbI$_3$. As a result, light yellow, needle-like HPbI$_3$ crystals are formed. The as-crystallized HPbI$_3$ solid was then collected and washed, and then dried at 60° C. for 10 hours under vacuum.

Methylamine (CH$_3$NH$_2$) gas was synthesized as follows: 10 g CH$_3$NH$_4$Cl (98%) and 10 g KOH (85%) powders were sequentially dissolved in 100 mL H$_2$O and then heated to 60° C. The resulting gas were passed through a CaO dryer to remove any moisture. CH$_3$NH$_2$ (anhydrous, ≥98%) is also commercially available. No obvious difference in the resultant film morphology or device performance was observed when either gas source was used.

To form a uniform highly-crystalline CH$_3$NH$_3$PbI$_3$ (MAPbI$_3$) film on a substrate, 60 wt % HPbI$_3$ DMF solution was prepared first using the as-prepared HPbI$_3$ solids. The solution was then spin-coated on the substrate at 6000 rpm for 20 seconds to form an HPbI$_3$ film, which was followed by heat-treatment at 150° C. for 30 seconds. Once cooled to the room temperature, the HPbI$_3$ film was exposed to CH$_3$NH$_2$ gas for 2 seconds, and rapidly degassed by removing the gas atmosphere, resulting in a black film. The film was finally heated at 150° C. for 5 minutes.

Figure 7:
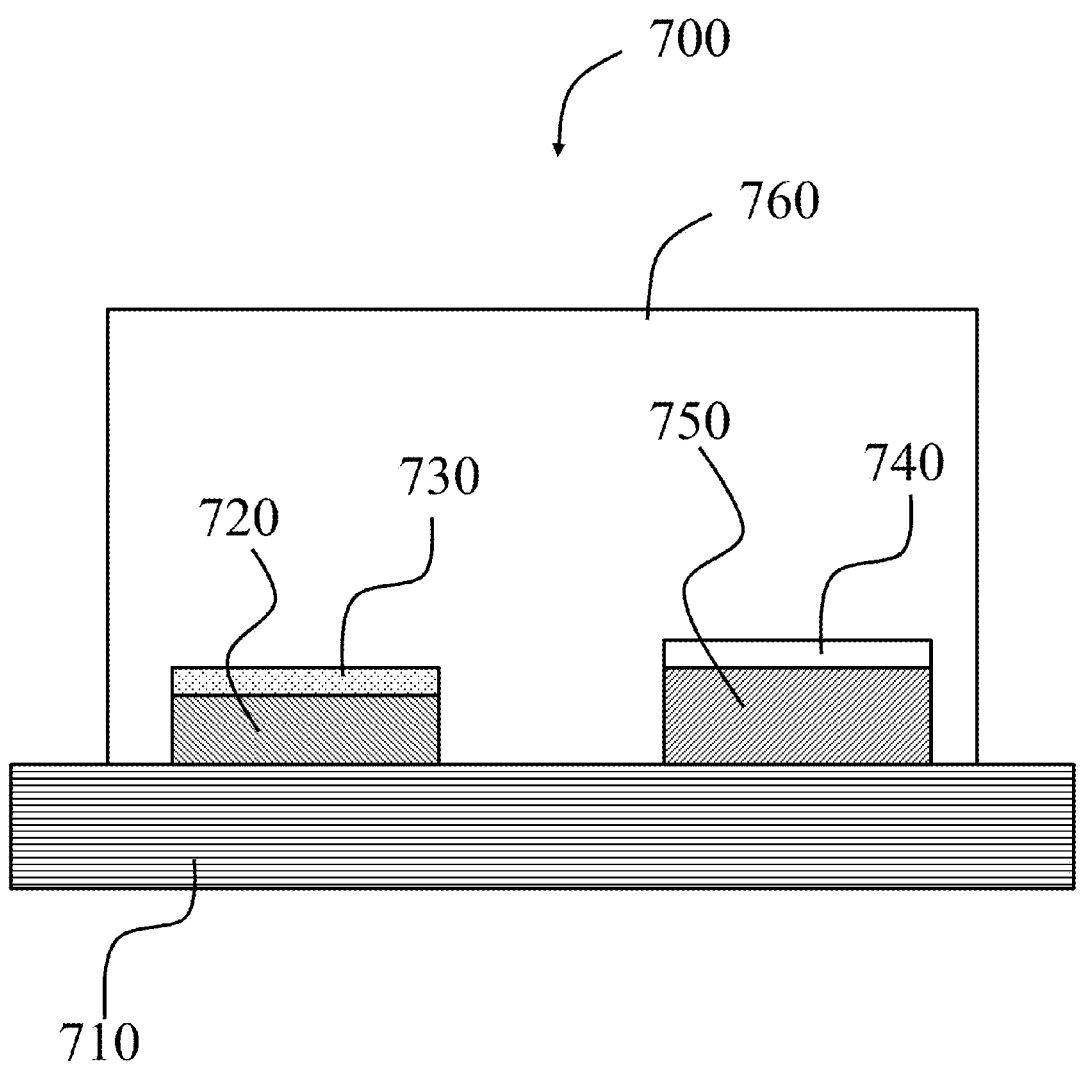
FIG. 7 illustrates a schematic of a system for the generation of H$_2$N—CH=NH (formylimidamide) gas, and the treatment of MAPbI$_3$ film for its conversion to α-FAPbI$_3$ film, according to some embodiments of the present disclosure.

FIG. 7 illustrates a system 700 used to convert a MAPbI$_3$ perovskite film 730 to a α-FAPbI$_3$ perovskite film 730, by heating the as-prepared MAPbI$_3$ perovskite film 730 at 150° C. for 1 to 5 minutes in an atmosphere of H$_2$N—CH=NH (formylimidamide) gas. The gas was generated by reacting HC(NH$_2$)$_2$CH$_3$COOH salt (formamidine acetate or FA(Ac)) with NaOH (see reference numeral 750). The resulting gas (not shown) passed through a CaO dryer 740 to remove any moisture. The entire system 700 was enclosed in a gas-tight box 760.

Materials Characterization. X-ray diffraction (XRD) patterns were obtained using an X-ray diffractormeter (D8 Advance, Bruker, Germany) with Cu Kα radiation (λ=1.5406 Å); 0.02° step and 2 s/step dwell. UV-vis absorption spectra of the films were recorded using spectrometer (U-4100, Hitachi, Japan). Surface and cross-sections (fractured) morphology of the perovskite solar cells (PSCs) were observed in a scanning electron microscope (SEM; LEO 1530VP, Carl Zeiss, Germany).

Device Fabrication and Characterization. For the fabrication of the PSCs, a compact TiO$_2$ electron-transporting layer (ETL) was first deposited on pre-patterned FTO-coated glass (TEC15, Hartford Glass Co., Hartford City, Ind.) by spray pyrolysis at 450° C. Mesoporous TiO$_2$ layer was spin-coated at 2000 rpm for 35 seconds from TiO$_2$ paste, which consists of 5.4% TiO$_2$ nanoparticles and 1.6% ethyl cellulose in terpineol/ethanol (3/7 weight ratio) solution. The mesoporous layer was sintered at 450° C. for 30 minutes. The perovskite layer was then deposited using the procedure described above. This was followed by spin-coating a hole-transporting material (HTM) solution, which consisted of 80 mg 2,2',7,7'-tetrakis(N,N-dip-methoxyphenylamine)-9,9'-spirobifluorene (spiro-MeOTAD), 30 μl bis(trifluoromethane) sulfonimide lithium salt stock solution (500 mg Li-TFSI in 1 ml acetonitrile), and 30 μl 4-tert-butylpyridine (TBP), and 1 ml chlorobenzene solvent. The HTM spin-coating process was performed in a dry-air atmosphere with humidity <10%. Finally a 150 nm Ag layer was deposited using thermal evaporator and a shadow mask.

The J-V characteristics of the PSCs were obtained using a 2400 SourceMeter (Keithley, Cleveland, Ohio) under simulated one-sun AM 1.5G illumination (100 mW·cm$^{-2}$) (Oriel Sol3A Class AAA Solar Simulator, Newport Corporation, Irvine, Calif.). Typical J-V scan started from short-circuit to open circuit and then back to short-circuit at the rate of 20 mV·s$^{-1}$. A typical active area of 0.12 cm$^2$ was defined using a non-reflective mask for the J-V measurements. The EQE spectra were recorded at a chopping frequency of 5 Hz in AC mode on a solar cell quantum efficiency measurement system (QEX10, PV Measurements, Boulder, Colo.).

Figure 8:
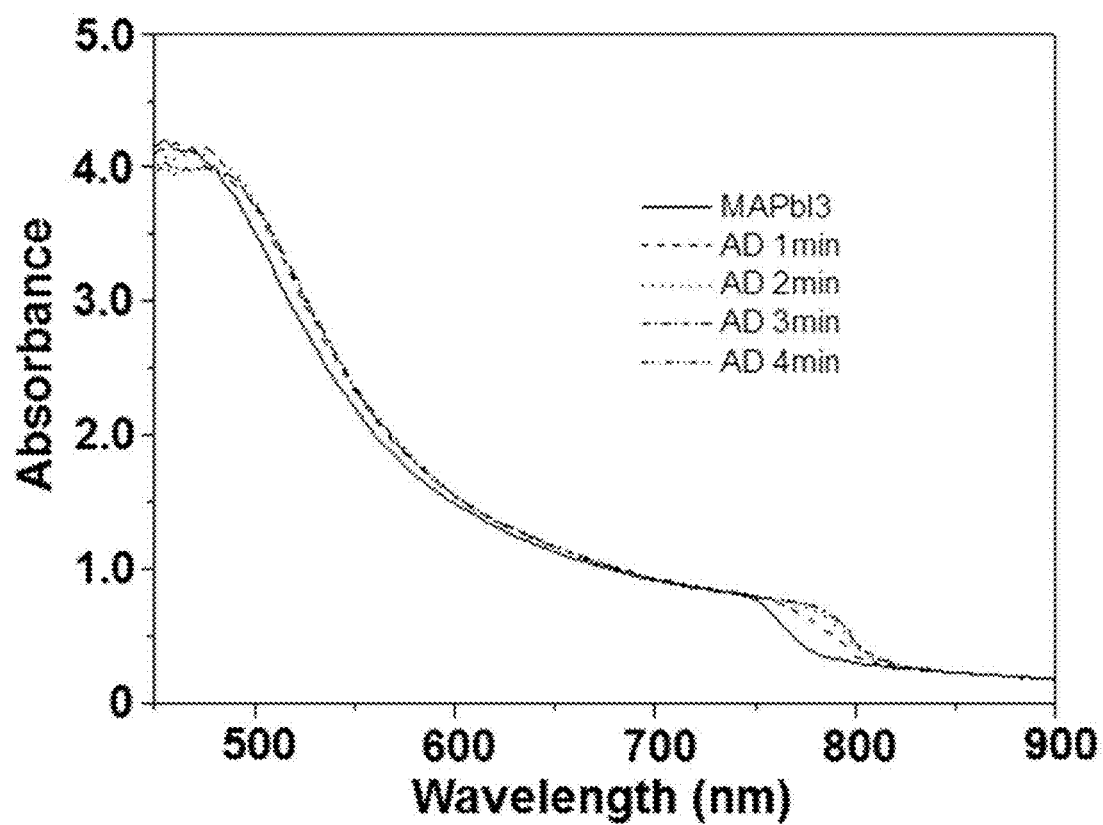
FIG. 8 illustrates the evolution of absorption spectra of perovskite structures from MAPbI$_3$ to FAPbI$_3$ as a function of aminium displacement (AD) reaction time, according to some embodiments of the present disclosure.

Finally, MAPbI$_3$ was converted to FAPbI$_3$ by placing the MAPbI$_3$ film in formylimidamide gas environment at elevated temperature (e.g., about 160° C.) for a certain period of time (e.g., several minutes). Methyl ammonium was replaced by formamidinium following the aminium displacement reaction shown in reaction (1) above. FIG. 8 shows the absorption spectral evolution of perovskite structure from MAPbI$_3$ to FAPbI$_3$ as a function of the reaction time.

EXAMPLES

Example 1

A method comprising exchanging at least a portion of a first cation of a perovskite solid with a second cation, wherein the exchanging is performed by exposing the perovskite solid to a precursor of the second cation, such that the precursor of the second cation oxidizes to form the second cation and the first cation reduces to form a precursor of the first cation.

Example 2

The method of Example 1, wherein the exchanging is performed by exposing the perovskite solid to a gas comprising the precursor of the second cation.

Example 3

The method of Example 1, wherein the exchanging is performed by exposing the perovskite solid to a solution comprising the precursor of the second cation.

Example 4

The method of Example 3, wherein the exposing is performed with the gas at a pressure between about 0.1 atmospheres and about 5 atmospheres.

Example 5

The method of Example 4, wherein the pressure is between one atmosphere and two atmospheres.

Example 6

The method of Example 1, wherein the exchanging is performed at a temperature greater than 20° C.

Example 7

The method of Example 6, wherein the temperature is between 100° C. and 300° C.

Example 8

The method of Example 1, wherein the perovskite solid comprises at least one of a particle or a film.

Example 9

The method of Example 8, wherein the film has a thickness between 10 nm and 3 μm.

Example 10

The method of Example 1, wherein the perovskite solid comprises ABX$_3$, A comprises at least one of the first cation or the second cation, B comprises a third cation, and X comprises an anion.

Example 11

The method of Example 10, wherein the first cation comprises methyl ammonium.

Example 12

The method of Example 10, wherein the second cation comprises at least one of formamidinium, guanidinium, acetamidinium, or ethylammonium.

Example 13

The method of Example 12, wherein the second cation comprises formamidinium.

Example 14

The method of Example 10, wherein the third cation comprises a metal in the 2+ valence state.

Example 15

The method of Example 14, wherein the metal comprises at least one of lead, tin, or germanium.

Example 16

The method of Example 10, wherein the anion comprises a halogen.

Example 17

The method of Example 16, wherein the halogen comprises at least one of fluorine, chlorine, bromine, or iodine.

Example 18

The method of Example 1, wherein the precursor of the second cation comprises at least one of formylimidamide, guanidine, acetamidine, or ethylamine.

Example 19

The method of Example 1, wherein the precursor of the first cation comprises methylammonia.

Example 20

The method of Example 1, wherein the portion is up to and including 100%.

Example 21

The method of Example 1, wherein the perovskite solid is converted from methylammonium lead triiodide to formamidinium lead triiodide.

Example 22

The method of Example 1, further comprising, prior to the exchanging, forming the perovskite solid by at least one of a solution deposition method or a vapor deposition method.

Example 23

The method of Example 2, further comprising producing the gas by reacting a salt-precursor of the precursor of the second cation with a hydroxide salt.

Example 24

The method of Example 23, wherein the salt-precursor of the precursor of the second cation comprises formamidine acetate.

Example 25

The method of Example 24, wherein the hydroxide salt comprises sodium hydroxide.

Example 26

A device comprising a film of formamidinium lead triiodide, wherein the formamidinium lead triiodide has short-circuit density of greater than 22.0 mA/cm$^2$.

Example 27

The device of Example 26, wherein the film has thickness between 10 nm and 3 μm.

Example 28

The device of Example 26, further comprising a substrate, wherein the film is in physical contact with the substrate.

Example 29

The device of Example 28, wherein the substrate comprises at least one of at least one of a transparent conducting oxide, a glass, a metal foil, or a plastic.

Example 30

The device of Example 26, wherein the device has a power-conversion efficiency of greater than 17%.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A method comprising:
   exposing a first perovskite comprising a first cation, lead, and iodine to a gas comprising at least one of formylimidamide, guanidine, acetamidine, ethylamine, or methylammonia, wherein:
   the exposing is performed at a temperature between 100° C. and 300° C.,
   the exposing results in an exchange of the first cation with a second cation comprising at least one of methylammonium, formamidinium, guanidinium, acetamidinium, or ethylammonium, and
   the exchange converts the first perovskite to a second perovskite comprising lead, iodine, and the second cation.

2. The method of claim 1, wherein the exposing is performed with the gas at a pressure of one atmosphere.

3. The method of claim 1, wherein the first perovskite is in a form comprising at least one of a particle or a film.

4. The method of claim 1, wherein the first perovskite comprises $ABX_3$, A comprises the first cation, B comprises $Pb^{2+}$, and X comprises $I^-$.

5. The method of claim 4, wherein the first cation comprises methylammonium.

6. The method of claim 5, wherein the second cation comprises formamidinium.

7. The method of claim 5, wherein the exposing results in the formation of methylammonia.

8. The method of claim 1, wherein the second perovskite comprises at least one of methylammonium lead triiodide, formamidinium lead triiodide, guanidinium lead triiodide, acetamidinium lead triiodide, or ethylammonium lead triiodide.

9. The method of claim 1, further comprising:
   prior to the exposing, forming the first perovskite by at least one of a solution deposition method or a vapor deposition method.

10. The method of claim 1, further comprising:
prior to the exposing, reacting formamidine acetate with sodium hydroxide to form the formylimidamide.

* * * * *